United States Patent [19]

Dower et al.

[11] Patent Number: 5,326,619
[45] Date of Patent: Jul. 5, 1994

[54] THERMAL TRANSFER DONOR ELEMENT COMPRISING A SUBSTRATE HAVING A MICROSTRUCTURED SURFACE

[75] Inventors: William V. Dower, St. Paul; Mark K. Debe, Stillwater, both of Minn.

[73] Assignee: Minnesota Mining and Manufacturing Company, Saint Paul, Minn.

[21] Appl. No.: 144,731

[22] Filed: Oct. 28, 1993

[51] Int. Cl.$^5$ .................................................. B41M 5/26
[52] U.S. Cl. .................................. 428/164; 428/156; 428/195; 428/202; 428/209; 428/336; 428/337; 428/341; 428/913; 428/914; 430/200; 430/201; 430/253; 430/271; 430/275; 430/276; 430/964
[58] Field of Search ............... 428/156, 164, 195, 202, 428/209, 336, 337, 341, 913, 914; 430/200, 201, 253, 271, 275, 276, 964

[56] References Cited

U.S. PATENT DOCUMENTS

| | | | |
|---|---|---|---|
| 3,645,917 | 2/1972 | Vandenberg | 260/2 A |
| 4,340,276 | 7/1982 | Maffitt et al. | 428/458 |
| 4,364,993 | 12/1982 | Edelman et al. | 428/408 |
| 4,396,643 | 8/1983 | Kuehn et al. | 427/160 |
| 4,426,437 | 1/1984 | Fisch et al. | 430/166 |
| 4,430,366 | 2/1984 | Crawford et al. | 427/162 |
| 4,582,111 | 4/1986 | Kuehn et al. | 164/46 |
| 4,587,198 | 5/1986 | Fisch | 430/201 |
| 4,588,674 | 5/1986 | Stewart et al. | 430/273 |
| 4,705,739 | 11/1987 | Fisch | 430/276 |
| 4,812,352 | 3/1989 | Debe | 428/142 |
| 4,879,419 | 11/1989 | Johannessen | 568/606 |
| 5,039,561 | 8/1991 | Debe | 427/162 |
| 5,089,372 | 2/1992 | Kirihata et al. | 430/167 |
| 5,156,938 | 10/1992 | Foley et al. | 428/195 |
| 5,171,650 | 12/1992 | Ellis et al. | 430/20 |
| 5,238,729 | 8/1993 | Debe | 428/245 |

Primary Examiner—Pamela R. Schwartz
Attorney, Agent, or Firm—Gary L. Griswold; Walter N. Kirn; Thomas C. Lagaly

[57] ABSTRACT

Laser-addressable thermal transfer donor elements for producing color proofs, printing plates, films, printed circuit boards, and other media are disclosed. The thermal transfer donor elements include a substrate having a microstructured surface. The microstructured surface contain a plurality of randomly positioned discrete protuberances of varying heights and shapes. The donor elements further include a black metal layer on the microstructured surface and a gas-producing polymer layer over the black metal layer. The gas-producing polymer in the gas-producing polymer layer has a thermally available nitrogen content of greater than about 10 weight percent. A thermal mass transfer material (e.g., a colorant such as a dye or pigment) is included in or over the gas-producing polymer layer.

33 Claims, 1 Drawing Sheet

THERMAL TRANSFER DONOR ELEMENT COMPRISING A SUBSTRATE HAVING A MICROSTRUCTURED SURFACE

FIELD OF THE INVENTION

The present invention relates to thermally imageable materials for the production of printed circuit boards as well as color proofs, printing plates, films, and other graphic arts media using thermal transfer imaging methods. More particularly, the invention relates to thermal transfer donor elements having a gas-producing polymer and a black metal radiation absorber on a substrate with a microstructured surface.

BACKGROUND OF THE INVENTION

The phenomenon of laser-induced ablation transfer imaging is generically known and is believed to entail both complex non-equilibrium physical and chemical mechanisms. Such laser-induced ablation transfer is thought to be effected by the rapid and transient accumulation of pressure beneath and/or within a mass transfer layer initiated by imagewise irradiation. Transient pressure accumulation can be attributed to one or more of the following factors: rapid gas formation via chemical decomposition and/or rapid heating of trapped gases, evaporation, photo expansion, thermal expansion, ionization and/or by propagation of a pressure-wave. The force produced by the release of such pressure is sufficient to cause transfer of the imaging layer to an adjacent receptor element. The force is preferably sufficient to effect the complete transfer of the exposed area of an entire layer rather than the partial or selective transfer of components thereof.

Laser-induced thermal mass transfer of materials from a donor sheet to a receptor layer has been described in the patent and technical literature for nearly thirty years. However, few commercial systems have utilized this technology. Exposure fluences required to transfer materials to a receptor have been, at best, on the order of 0.1 Joule/cm$^2$ (i.e., J/cm$^2$). Consequently, lasers capable of emitting more than 5 Watts of power, typically water-cooled Nd:YAG lasers, have been required to produce large format images (A3 or larger) in reasonable times. These lasers are expensive and impractical for many applications. More recently, single-mode laser diodes and diode-pumped lasers producing 0.1-4 Watts in the near infrared region of the electromagnetic spectrum have become commercially available. Diode-pumped Nd:YAG lasers are good examples of this type of source. They are compact, efficient, and relatively inexpensive. In order to use these new sources in a single-beam, large format imaging system, the exposure fluence of thermal transfer materials should be reduced to less than 0.04 J/cm$^2$ and the exposure pixel dwell time should be less than 300 nanoseconds. There have been many unsuccessful efforts in the art to achieve this goal.

Recently, however, U.S. Pat. No. 5,278,023, entitled "PROPELLANT-CONTAINING THERMAL TRANSFER DONOR ELEMENTS," disclosed a thermal transfer donor element containing a gas-producing polymer having a thermally available nitrogen content of greater than about 10 weight percent, a radiation absorber, and a thermal mass transfer material. Such gas-producing polymers generate a high propulsive force, thereby decreasing the exposure fluence required to induce transfer of imaging material to a receptor layer material. For this reason, the gas-producing polymers enable the use of simple, single-beam scanners based on diode-pumped lasers such as diode-pumped Nd:YAG lasers.

Generally, three types of radiation absorbers are used in thermal mass transfer imaging systems: dyes, particles, and thin layers of metal. The use of dyes as a radiation absorber is disclosed in U.S. Pat. No. 5,156,938. In this role, however, dyes are undesirable because of their high cost, reactivity/incompatibility with other components of the thermal transfer system (which, in turn, leads to instability and a low shelf life), and susceptibility to decomposition under the high temperature conditions which exist during thermal imaging.

Particle-type radiation absorbers are disclosed in, e.g., U.S. Pat. No. 4,588,674, UK Patent Application GB 2 083 726, and Japanese Kokai Patent Application No. SHO 63[1988]-161445. Such particles are generally dispersed in a binder. The most common particle-type radiation absorber is carbon black. Because the particles are discrete and randomly distributed in the binder, they must be present in relatively thick (i.e., greater than 0.5 micrometers) layers in order to generate sufficient heat for mass transfer. Since the amount of radiant energy required to heat a layer is directly proportional to the thickness of that layer, however, such thick layers are undesirable from both a speed and energy usage standpoint. In addition, when carbon black is used as a particle absorber (which is typically the case), the persistent color of the particles generally restricts their use to thermal mass transfer systems which are black and white.

Thin-layered metal absorbers avoid the disadvantages of dye and particle absorbers by combining low cost, high compatibility and high stability with the ability to provide sufficient heat for mass transfer when coated in thin (i.e., around 0.1 to 0.01 micrometers) layers. In this manner, thin-layered metal radiation absorbers increase the efficiency of the imaging process by allowing greater speed and lower energy usage. For example, copending U.S. patent application Ser. No. 08/033,112, filed Mar. 18, 1993 and entitled "LASER PROPULSION TRANSFER USING BLACK METAL COATED SUBSTRATES," discloses a thermal transfer donor element containing, in order, a substrate, a black metal radiation absorbing layer on one surface of the substrate, a gas generating polymer layer over the black metal layer, and a colorant over the black metal layer. The donor element is particularly useful for ablative thermal mass transfer imaging.

SUMMARY OF THE INVENTION

In accordance with the present invention, it has now been discovered that the efficiency of ablative thermal mass transfer imaging, as well as the quality of the resultant image, can be further improved by applying a black metal radiation absorbing layer to a substrate which has a microstructured surface.

Thus, the present invention provides a thermal transfer donor element, comprising:

a) a substrate having a microstructured surface, the microstructured surface comprising a plurality of randomly positioned discrete protuberances of varying heights and shapes;

b) a black metal layer on the microstructured surface;

c) a gas-producing polymer layer having a thermally available nitrogen content of greater than about 10 weight percent, the gas-producing polymer layer being over the black metal layer; and d) a thermal mass transfer material in or over the gas-producing polymer layer.

As used herein:

"microstructured surface" refers to a surface having a plurality of randomly positioned discrete protuberances of varying heights and shapes (typically spire-shaped with heights ranging from, e.g., 10 to 1500 nm and being separated from adjacent protuberances at a distance ranging from 3 to 500 nm) and prepared, e.g., in accordance with the teachings of U.S. Pat. Nos. 4,340,276 or 4,396,643;

"black metal layer" refers to a thin layer (e.g., between 0.01 to I micrometer) of a mixture of metal, metal oxide, and/or metal sulfide which may be produced in accordance with known methods such as the teachings of U.S. Pat. No. 4,430,366;

"thermally available nitrogen content" refers to the nitrogen content (weight percentage basis) of a material which, upon exposure to heat (preferably less than about 300° C. and more preferably less than about 250° C.), generates or liberates nitrogen ($N_2$) gas; and "thermal mass transfer material" refers to a material such as, for example, a colorant, pigment, or a crystalline dye (with or without binder) which is transferred in a substantially non-molecular state, i.e., as pieces, chunks, aggregates, or groups of associated molecules, in thermal imaging processes from a donor element to the surface of a receptor element by action of a thermal source.

The thermal transfer donor element is particularly advantageous for laser addressed ablative thermal mass transfer imaging. The microstructured surface improves the efficiency of the present donor element beyond those which employ thin-layered metal absorbers without a microstructured surface by decreasing the loss of radiant energy due to reflection and by increasing the contact surface area between the black metal absorber and the gas-producing polymer. The increased contact surface area, in turn, enhances the conversion (by the black metal) of laser energy to heat, and also the diffusion of that heat from the black metal to the surrounding gas-producing polymer.

Surprisingly, the microstructured surface has also been found to improve the quality of the final image produced by the present donor element beyond those images which are produced by conventional donor elements having thin-layered metal absorbers without a microstructured surface. During ablative mass transfer imaging, pieces of metal which are large enough to effect the quality of the resulting image are observed to separate from conventional (i.e., planar, non-microstructured) metal absorbing layers and carry over onto the image produced on a receptor sheet along with the ablated mass transfer material. Such pieces of metal are visibly noticeable in the final image. This deleterious effect is substantially avoided by layering a black metal radiation absorber on a microstructured surface. Such a construction reduces both the occurrence and size of metal particles which are carried over to the receptor sheet during ablative imaging such that the metal particles do not noticeably degrade the quality of the final image.

Other aspects, benefits, and advantages of the present invention are apparent from the detailed description, examples, and claims.

DETAILED DESCRIPTION OF THE INVENTION

Figure 1:
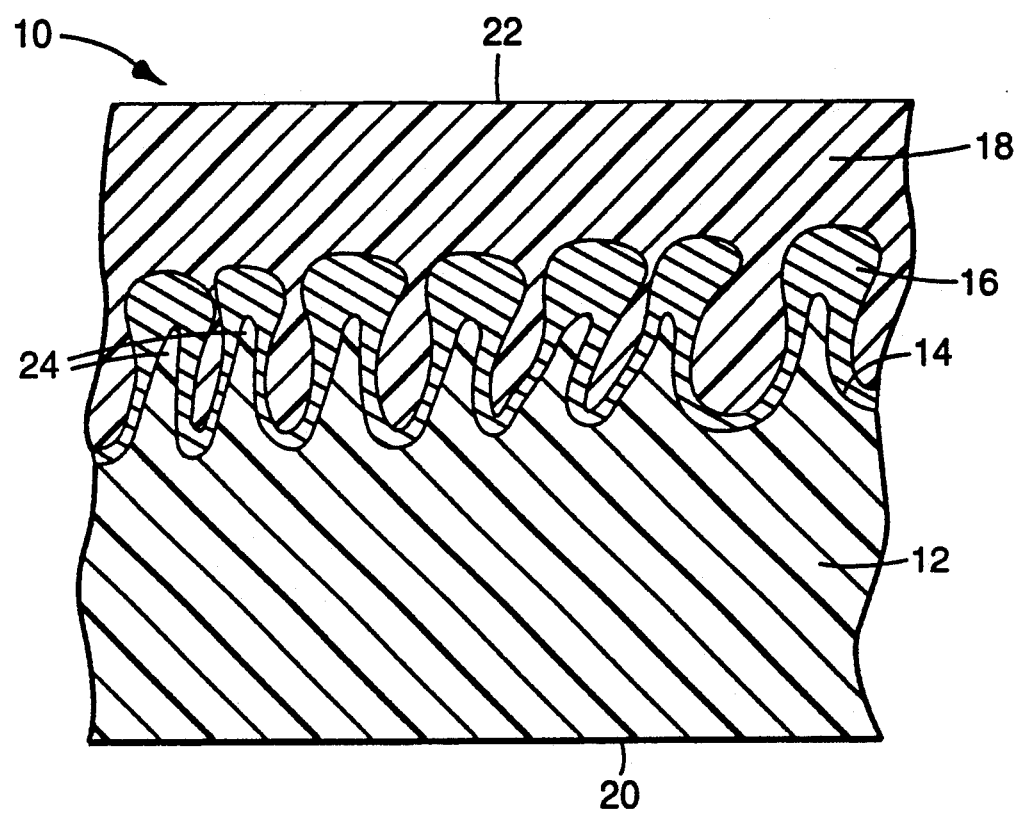
FIG. 1 is an enlarged sectional view of the present thermal transfer donor element, and illustrates a substrate with a microstructured surface, a black metal layer on the microstructured surface, and a mixture of a gas-producing polymer and a thermal mass transfer material layered on the black metal layer.

Referring to FIG. 1, there is shown a thermal transfer donor element 10 prepared in accordance with the present invention. Donor element 10 includes a substrate 12 with a microstructured surface 14, a black metal layer 16 on microstructured surface 14, and a mixture 18 of a gas-producing polymer and a thermal mass transfer material layered on black metal layer 16. As an alternative to mixture 18, the gas-producing polymer and thermal mass transfer material may be present in separate layers, with the gas-producing polymer layer being over black metal layer 16 and the mass transfer material being on the gas-producing polymer layer (e.g., as a continuous layer). A single-layered mixture 18, however, is preferred.

Suitable materials from which substrate 12 may be constructed include, without limitation, plastic sheets and films such as those made of polyethylene terephthalate, fluorene polyester polymer consisting essentially of repeating interpolymerized units derived from 9,9-bis(4-hydroxyphenyl)fluorene and isophthalic acid, terephthalic acid or mixtures thereof, polyethylene, polypropylene, polyvinyl chloride and copolymers thereof, and hydrolyzed and unhydrolyzed cellulose acetate. Preferably, substrate 12 is transparent so that a laser may be imaged through the bottom surface 20 of donor element 10. This allows the use of a non-transparent receptor sheet (which is placed in contact with the top surface 22 of donor element 10 during the imaging process).

Microstructured surface 14 comprises a plurality of randomly positioned discrete protuberances 24 of varying heights and shapes. Protuberances 24 are generally columnar (e.g., spire-shaped) with a height ranging from 10 to 1500 nm, and are separated from adjacent protuberances at a distance ranging from 3 to 500 nm (as measured from the tips of the protuberances). Microstructured surface 14 may be prepared by any known method such as, e.g., in accordance with the teachings of U.S. Pat. Nos. 4,340,276 or 4,396,643, the disclosures of which are incorporated herein by reference. The method disclosed in U.S. Pat. No. 4,340,276 is preferred. In accordance with the disclosure thereof, microstructured surface 14 can be formed by first selecting a substrate having a predetermined rate of sputter etching under a given set of sputtering conditions. A material having a lower rate of sputter etching under the same set of conditions (e.g., a refractory metal such as chromium) is then applied to the substrate in an average thickness in the range of 0.1 to 10 nm, thereby forming a composite surface on which portions of the underlying substrate are exposed between discontinuous microislands of the lower sputter rate material. Finally, the composite surface is sputter etched to preferentially etch the exposed portions of the higher sputtering rate substrate, while the discontinuous microislands are etched at a lower rate, resulting in a topography of randomly positioned discrete protuberances of varying heights and shapes.

Black metal layer 16 is preferably a mixture of metal, metal oxide, and/or metal sulfide, and may be produced by any suitable method, such as in accordance with the teachings of U.S. Pat. No. 4,430,366, the disclosure of which is incorporated herein by reference. The most preferred mixture is of metal and metal oxide. By the term "black" it is meant that the metal layer provides a transmission optical density of at least 0.3, preferably at least 0.6, more preferably at least 0.8, and most preferably at least 1.0 at the wavelength of the imaging radiation, and the reflected light is less than 20% of the incident light on the black surface.

In accordance with U.S. Pat. No. 4,430,366, black metal layer 16 can be applied to microstructured surface 14 in conventional vapor deposition environments into which there is the controlled release of one or more of the following reactive materials: oxygen, water vapor, sulphur vapor, or $H_2S$. By the controlled introduction of these materials into a metal vapor stream of a conventional vapor deposition apparatus during the vapor deposition of metals onto substrates, controlled conversion of the metal to metal oxides or metal sulfides is effected. The introduction of these oxygen or sulfur-containing vapors may be confined to specific regions of the vapor stream or to the chamber. This minimizes degradation of components of the apparatus and enables control over both the composition and the gradation in the composition of the coated layer across its thickness.

Substantially any metal capable of forming an oxide or sulfide can be used in the practice of this invention for black metal layer 16. In particular aluminum, tin, chromium, nickel, titanium, cobalt, silver, zinc, iron, lead, manganese, copper and mixtures thereof can be used. Not all of these metals when converted to metal oxides or sulfides according to the above-described process will form materials having all of the specifically desirable properties (e.g., optical density, light transmissivity, etc.). However, all of these metal oxide- or sulfide-containing layers formed according to the practice of the present invention will be useful and contain many of the benefits of the present process including bondability to polymeric materials. The metal vapors in the chamber may be supplied by any of the various known techniques suitable for the particular metals, e.g., electron beam vaporization, resistance heaters, etc. Reference is made to *Vacuum Deposition Of Thin Films*, L. Holland, 1970, Chapman and Hall, London, England with regard to the many available means of providing metal vapors and vapor coating techniques, in general.

Metal oxide or sulfide-containing layers, the black metal layers according to the present invention, may be deposited as thin layers of molecular dimensions up through dimensions in micrometers. The composition of the layer throughout its thickness may be readily controlled as herein described.

The conversion to graded metal oxide or metal sulfide is effected by the introduction of oxygen, sulfur, water vapor or hydrogen sulfide at points along the metal vapor stream. By introducing these gases or vapors at specific points along the vapor stream in the vapor deposition chamber, a coating of a continuous or graded composition (throughout the thickness of the layer) may be obtained as desired. By selectively maintaining a gradation of the concentration of these reactive gases or vapors across the length of the vapor deposition chamber through which the substrate to be coated is being moved, an incremental gradation of the composition of the coating layer (throughout its thickness) is obtained because of the different compositions (i.e., different ratios of oxides or sulfides to metals) being deposited in different regions of the vapor deposition chamber. One can in fact deposit a layer comprising 100% metal at one surface (the top or bottom of the coating layer) and 100% metal oxide or sulfide at the other surface.

A substrate which is to be coated continuously moves along the length of the chamber from an inlet area of the vapor deposition chamber to an outlet area. Metal vapor is deposited over a portion of the length of the chamber, and the proportion of metal oxide or sulfide being codeposited with the metal at any point along the length of the chamber (or deposited as 100% oxide or sulfide) depends upon the amount of reactive gas or vapor which has entered that portion of the metal vapor stream which is being deposited at that point along the length of the chamber.

It is desirable that the reactive gas or vapor enter the stream itself and not just diffuse into the stream. The latter tends to cause a less controllable distribution of oxides within the stream. By injecting or focussing the entrance of the reactive gas or vapor into the stream itself, a more consistent mixing in that part of the stream is effected.

Transitional characteristics bear an important relationship to some of the properties of the black metal products. The coating has dispersed phases of materials therein, one the metal and the other the metal oxide or sulfide. The latter materials are often transparent or translucent, while the former are opaque. By controlling the amount of particulate metal which remains dispersed in the transparent oxide or sulfide phase, the optical properties of the coating can be dramatically varied. Translucent coatings of yellowish, tan, and gray tones may be provided, and substantially opaque black film may be provided from a single metal by varying the percentage of conversion of the metal to oxide during deposition of the coating layer.

Preferably, black metal layer 16 comprises black aluminum, black tin, or black titanium and has a thickness ranging from 0.01 to 1 micrometer. For reason of speed and energy efficiency, black metal layer 16 is more preferably as close to 0.01 micrometer in thickness as possible. Depending upon the circumstances, however, a thicker or thinner layer may be desired.

As depicted in FIG. 1, black metal layer 16 substantially conforms to the contour of microstructured surface 14 so that black metal layer 16 extends into layer 18 (containing the gas-producing polymer and thermal mass transfer material) in conformance with each of protuberances 24. In effect, black metal layer 16 itself provides a microstructured surface. This construction results in a highly efficient thermal mass transfer medium by decreasing the loss of radiant energy (e.g., from an imaging laser) due to reflection, and by increasing the contact surface area between black metal layer 16 and the gas-producing polymer and/or thermal mass transfer material in layer 18. The increased surface area, in turn, enhances the conversion (by black metal layer 16) of radiant energy to heat, and also enhances the diffusion of that heat from the black metal to the surrounding gas-producing polymer and/or thermal mass transfer material in layer 18.

For some applications, the efficiency of donor element 10 in thermally transferring an image is high enough that a gas-producing polymer may optionally be excluded from the donor element construction. In this instance, heat from black metal layer 16 acts directly on the mass transfer material and causes it to transfer to a receptor sheet by, e.g., sublimation or vaporization of that portion of the mass transfer material which is closest to the irradiated areas of black metal layer 16. However, it is preferred that a gas-producing polymer be present in the donor element construction. Notwithstanding the effects on the cohesiveness and adhesiveness of the thermal mass transfer material, a gas-producing polymer generally improves the imaging process by allowing the irradiation source to image at greater speed and/or with lower energy usage than would otherwise be possible.

In addition to increased imaging efficiency, the microstructured surface of black metal layer 16 also reduces the size and occurrence of black metal particles which may be carried over to a receptor sheet during the ablative imaging process such that the metal particles do not noticeably affect the quality of the final image. As compared to a planar, non-microstructured black metal layer, the microstructured surface of black metal layer 16 is believed to reduce the cohesiveness of the black metal layer, thereby reducing the tendency for black metal to separate from the rest of the black metal layer in large chunks when exposed to irradiation. In this manner, the black metal/microstructured surface also serves to improve the final image created by the donor element of the present invention.

As illustrated in FIG. 1, black metal layer 16 may form a mushroom-like shape on each of protuberances 24. This shape, when present, is believed to further contribute to improved efficiency of black metal layer 16 in absorbing radiation from an imaging source and heating layer 18. The "head" of each black metal/protuberance structure provides further heat transfer surface area between black metal layer 16 and the gas-producing polymer/thermal mass transfer material in layer 18.

The gas-producing polymer has a thermally available nitrogen content greater than about 10 weight percent, preferably greater than about 20 weight percent, and more preferably greater than about 30 weight percent. Preferably, the gas-producing polymer is thermally decomposable at a temperature below about 300° C., and most preferably, below about 250° C.

The gas-producing polymer may be any polymer that liberates gas, especially nitrogen gas (N₂) when heated rapidly, such as, for example, by exposure of the construction to an infrared laser beam. Polymers that liberate nitrogen gas on heating generally have thermally decomposable functional groups. The polymer may itself be gas-liberating or may contain a dispersion or addition of materials that can decompose to produce gases when irradiated, such as diazonium salts and polymers. Non-limiting examples of suitable thermally decomposable functional groups include azido, alkylazo, diazo, diazonium, diazirino, nitro, difluoroamino, CF(NO₂)₂, cyano, nitrato, triazole, etc. The thermally decomposable groups may be incorporated into the gas-producing polymer either prior to polymerization or by modification of an existing polymer, such as, for example, by diazotization of an aromatic ring (e.g., with sodium nitrite) or diazo transfer with tosyl azide onto anamine or β-diketone in the presence of triethylamine.

In one preferred embodiment, the gas-producing polymer has the formula

 (I)

wherein:

X represents a hydroxyl, azide, mercapto, or amino (including mono-alkyl and mono-aryl substituted amino) group and preferably, X is an azide or a hydroxyl group;

R represents a divalent monomer group, containing a N₃ group, derived from a cyclic ether such as, for example, —CH₂CH(CH₂N₃)O—, —CH₂C(CH₃)(CH₂N₃)CH₂O—, —CH (CH₂N₃)CH₂O—, —CH₂C(CH₂N₃)₂CH₂O—, —CH(CH₂N₃)CH(CH₂N₃)O—, and —CH₂CH(N₃)CH₂O—; a cyclic sulfide such as, for example, —CH₂CH (CH₂N₃)S—, —CH₂C(CH₂N₃)₂CH₂S—, —CH(CH₂N₃)CH(CH₂N₃.)S—, and —CH₂CH(N₃)CH₂S—; and a cyclic amine such as, for example, —C₂CH(CH₂N₃)NR¹—, —CH(CH₂N₃)CH₂NR¹—, —CH₂C(CH₂N₃)₂CH₂NR¹—, —CH(CH₂N₃)CH(CH₂N₃)NR¹—, and —CH₂CH(N₃)CH₂NR¹—;

R¹ represents a hydrocarbyl group (e.g., alkyl, aryl, aralkyl, alkaryl, etc.);

L represents a mono-, di-, tri- or tetravalent alkyl radical. Non-limiting examples of monovalent radicals are methyl and ethyl. Non-limiting examples of polyvalent alkyl radicals are ethylene, methylene, propylene, 1,2,3-propanetriyl, 2,2-dimethylene-1,3-propanediyl, etc. Preferably, L is 1,2,3-propanetriyl;

corresponding to L, m represents 1, 2, 3, or 4; and n represents any positive integer greater than 1, preferably greater than 5, and more preferably greater than 10.

The foregoing gas-producing polymer of Formula (I) can be made by procedures well known to those skilled in the art of synthetic organic chemistry such as disclosed, for example, in U.S. Pat. Nos. 3,645,917 and 4,879,419, the disclosures of which are incorporated herein by reference.

One or more crosslinking agents may be employed in combination with the gas-producing polymer of Formula I to provide coatings having improved strength. The choice of an appropriate crosslinking agent depends on the functional groups pendant on the gas-producing polymer. Thus, if hydroxyl groups are present on the gas-producing polymer, then crosslinking agents for polyols could be employed (e.g., isocyanates). In cases where free-radically polymerizable pendant groups, such as acrylates, are attached to the polymer backbone, a free-radical initiator may be used as a crosslinking agent.

Preferably, a crosslinking agent for polyols is employed in combination with a gas-producing polymer having multiple hydroxyl end groups. Preferred crosslinking agents in this case are polyisocyanates, including but not limited to, hexamethylene diisocyanate; diphenylmethane diisocyanate; bis(4-isocyanatocyclohexyl)methane, 2,4-tolylene diisocyanate, etc.

In another preferred embodiment, the gas-producing polymer is a polyoxetane having recurring units of the following formula:

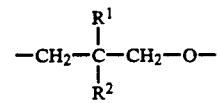 (II)

wherein $R^1$ and $R^2$ each independently represent a thermally decomposable nitrogen-containing group, e.g., azido, nitro, nitrato, triazole, etc. An example of a preferred azido group is —$CH_2N_3$. A preferred polyoxetane is poly[bis(azidomethyl)oxetane].

The gas-producing polymer of Formula (II) can be made by procedures well known to those skilled in the art of synthetic organic-chemistry such as disclosed, for example, in U.S. Pat. No. 3,694,383, the disclosure of which is incorporated herein by reference.

In another preferred embodiment, the gas-producing polymer is an energetic copolymer. An energetic copolymer may be defined as a polymer which contains functional groups which exothermically decompose to generate gases, shock waves, pressure, etc. when heated above a certain threshold temperature on the millisecond to nanosecond timescale. Preferably, the energetic copolymer has repeating units derived from different monomers, one or both of which have pendant energetic nitrogen-containing groups such as azido, nitro, nitrato, or nitramino derivatives. Preferably, the monomers are cyclic oxides having three to six ring atoms. The energetic monomers are preferably azido, nitro, triazole, or nitrato derivatives of oxirane, oxetane or tetrahydrofuran. Examples (non-inclusive) of such energetic copolymers are poly[bis(azidomethyl)oxetane] (BAMO), glycidyl azide polymers (GAP), polyvinyl nitrate (PVN), nitrocellulose, and polycarbonates. Copolymerization of the monomers is preferably carried out by cationic polymerization. The foregoing energetic copolymers and their method of preparation are disclosed in U.S. Pat. No. 4,483,978, the disclosure of which is incorporated herein by reference.

An energetic copolymer may also be defined as a polymeric material which contains energetic additives, gas forming additives, or catalysts for the thermal or photochemical decomposition thereof. Energetic additives may be used to modify the physical and thermal properties of the abovementioned energetic polymers. Such additives lower the decomposition temperature, and may be used either as plasticizers or "kickers." Examples (non-inclusive) of such additives are the energetic molecules RDX (hexahydro-1,3,5-trinitro-1,3,5-triazine), TNT (trinitrotoluene), and PETN (pentaerythritol tetranitrate). Gas forming additives are molecules which thermally decompose to form a large quantity of gaseous products. Examples (non-inclusive) include diazonium salts (e.g., 4-methoxybenzene diazonium tetrafluoroborate), azides (e.g., 4-azidobenzoic acid), and "blowing agents" (e.g., 2,2'-azobis-2-methylbutyronitrile and p-toluene sulfonylhydrazide). Catalysts are compounds which lower the temperature of decomposition of the energetic polymers or additives. Examples (non-inclusive) include acids, bases, and organometallic species such as ferric acetylacetonate.

Thermal mass transfer materials suitable for use in the present invention include dyes such as those listed in Venkataraman, *The Chemistry of Synthetic Dyes;* Academic Press, 1970: Vols. 1-4, and *The Colour Index* Society of Dyers and Colourists, Yorkshire, England, Vols. 1-8, including cyanine dyes (including streptocyanine, merocyanine, and carbocyanine dyes), squarylium dyes, oxonol dyes, anthraquinone dyes, and holopolar dyes, polycyclic aromatic hydrocarbons, etc.; metal oxides and mixed oxides such as titanium dioxide, silica, alumina, oxides of chromium, iron, cobalt, manganese, nickel, copper, zinc, indium, tin, antimony and lead, black aluminum; metal films derived from virtually any atmospherically stable metal including, but not limited to, aluminum, scandium, titanium, vanadium, chromium, manganese, iron, cobalt, nickel, copper, zinc, gallium, germanium, yttrium, zirconium, niobium, molybdenum, ruthenium, rhodium, palladium, silver, cadmium, indium, tin, antimony, lanthanum, gadolinium, hafnium, tantalum, tungsten, rhenium, osmium, iridium, platinum, gold, thallium, and lead; colored and/or fluorescent pigments known for use in the imaging arts including those listed in the *Pigment Handbook;* Lewis, P. A., Ed.: Wiley; New York, 1988, or available from commercial sources such as Hilton-Davis, Sun Chemical Co., Aldrich Chemical Co., Imperial Chemical Industries, etc.; semiconductors such as carbon (including diamond graphite), silicon, arsenic, gallium arsenide, gallium antimonide, gallium phosphide, aluminum antimonide, indium antimonide, indium tin oxide, zinc antimonide, etc.; electrographic or electrophotographic toners; phosphors, such as those used for television or medical imaging purposes; electroless plating catalysts; polymerization catalysts; curing agents; and photoinitiators.

It is often desirable to provide a modified surface (for example, to increase or decrease adhesion or wetability) to a receptor substrate in an image-wise fashion. For those applications, the transfer materials may be polymers or copolymers such as silicone polymers as described by M. W. Ranney in Silicones: Noyes Data Corp., 1977, Vols. 1 and 2; fluorinated polymers, polyurethanes, acrylic polymers, epoxy polymers, polyolefins, styrene-butadiene copolymers, styrene-acrylonitrile copolymers, polyethers, and phenolic resins such as novolak resins, and resole resins.

In other cases it is desirable to transfer curable materials such as monomers or uncured oligomers or crosslinkable resins. In those cases the thermal mass transfer material may be a polymerizable monomer or oligomer. The properties of the material should be selected so that volatility of the monomer or oligomer is minimal to avoid storage problems. Suitable polymerizable materials include acrylate-terminated polysiloxanes, polyurethanes, polyethers, etc.

To improve the imaging speed of the thermal mass transfer materials utilized in the present invention, one or more accelerators for azide decomposition may be added to the gas-producing polymer layer or a layer adjacent thereto. Useful accelerators for azide decomposition include those materials known in the art to reduce the decomposition temperature of alkyl azide compounds including, but not limited to, metal complexes such as ferrous acetylacetonate, stannous chloride, magnesium chloride, ferric chloride, zinc bromide, etc.; protic acids such as benzoic acid, acetic acid, p-toluenesulfonic acid, etc.; thermally sensitive free-radical initiators such as benzoyl peroxide, t-butyl perbenzoate, etc.; phosphines such as triphenylphosphine; and the like.

Sensitivity of the thermal mass transfer donor elements of the present invention may also be increased by incorporation of a surfactant (as described by M. R. Porter in *Handbook of Surfactants:* Blackie, Chapman and Hall; New York, 1991), preferably a fluorochemical surfactant. The surfactant may be incorporated in any of the layers of the thermal transfer donor element, preferably in the top layer of the donor element containing the thermal mass transfer material in order to reduce cohesion. Non-limiting examples of fluorochemical surfactants include Fluorad# surfactants sold by 3M Company.

As mentioned above, the thermal mass transfer material and gas-producing polymer may either be present as a single layer or as separate layers (with the mass transfer material being layered above the gas-producing polymer layer). In the case of a single mass transfer material/gas-producing polymer layer, preparation thereof may be carried out by introducing the components for making the layer into a suitable solvent(s) (e.g., water, tetrahydrofuran (THF), methyl ethyl ketone (MEK), toluene, methanol, ethanol, n-propanol, isopropanol, acetone, etc., and mixtures thereof); mixing the resulting solution at, for example, room temperature; coating the resulting mixture onto the substrate; and drying the resultant coating, preferably at moderately elevated temperatures. Suitable coating techniques include knife coating, roll coating, curtain coating, spin coating, extrusion die coating, gravure coating, etc. Preferably, the mass transfer material/gas-producing polymer layer has a dry coating weight ranging from 0.3 to 2.0 g/m$^2$. When the mass transfer material comprises a pigment in a binder, the mass transfer material/gas-producing polymer layer more preferably has a dry coating weight ranging from 0.5 to 1.5 g/m$^2$, and, most preferably, from 0.7 to 1.3 g/m$^2$.

When the thermal mass transfer material is coated as a separate layer on the gas-producing polymer, it may be coated by a variety of techniques including, but not limited to, coating from a solution or dispersion in an organic or aqueous solvent (e.g., bar coating, knife coating, slot coating, slide coating, etc.), vapor coating, sputtering, gravure coating, etc., as dictated by the requirements of the mass transfer material itself. In this instance, the gas-producing polymer layer preferably has a dry coating weight ranging from 0.01 to 1.0 g/m$^2$, more preferably from 0.05 to 0.5 g/m$^2$, and most preferably from 0.1 to 0.3 g/m$^2$. The thermal mass transfer material layer preferably has a dry coating weight ranging from 0.3 to 2.0 g/m$^2$, more preferably from 0.5 to 1.5 g/m$^2$, and, most preferably, from 0.7 to 1.3 g/m$^2$.

The thermal transfer donor elements of the present invention are used by placing them in intimate contact (e.g., vacuum hold-down) with a receptor sheet and imagewise heating the thermal transfer donor element. In order to provide rapid heating, one or more laser beams are used to provide the energy necessary for transfer. Single-mode laser diodes and diode-pumped lasers producing, for example, 0.1–4 Watt (W) in the near-infrared region of the electromagnetic spectrum may be used as energy sources. Preferably, a solid state infrared laser or laser diode array is employed. Laser exposure dwell times should be from about 0.1 to 5 microseconds and laser fluence should be from about 0.01 to about 1 J/cm$^2$.

Suitable image-receiving (thermal mass transfer-receiving) elements are well known to those skilled in the art. Non-limiting examples of image-receiving elements which can be utilized in the present invention include anodized aluminum and other metals; opaque or transparent polymer films (e.g., PET); and a variety of different types of paper (e.g., filled or unfilled, calendered, etc.).

In the practice of the present invention, the thermal transfer donor and receiving elements are brought into contact with one another such that upon application of heat, the thermal mass transfer material is transferred from the donor element to the receiving element. The black metal radiation absorbing layer utilized in the donor element of the present invention acts as a light-to-heat conversion element. A variety of light-emitting sources can be utilized in the present invention including infrared, visible, and ultraviolet lasers. The preferred lasers for use in this invention include high power (>100 mW) single mode laser diodes, fiber-coupled laser diodes, and diode-pumped solid state lasers (e.g., Nd:YAG and Nd:YLF). The most preferred lasers are diode-pumped solid state lasers. The laser exposure should raise the temperature of the thermal transfer medium, above 150° C. and most preferably above 200° C.

After transfer of the thermal mass transfer material from the donor to the receiving elements, an image is created on the receiving element and the donor element may be removed from the receiving element.

The donor material can be provided as sheets or rolls. Either of these can be single colored uniformly within the article, and multiple articles of different colors are used to produce a multi-colored image. Alternately, the donor materials could contain areas of multiple colors, with a single sheet or roll being used to generate multi-colored images.

The following non-limiting examples further illustrate the present invention.

EXAMPLES

Imaging was performed by placing the samples coated side down in a cylindrical drum section equipped with a vacuum hold down, either against a piece of 3M 7600 presentation paper (very smooth filled paper), or against a piece of Hewlett Packard HP 51630Y Cut Jet paper (very porous paper for ink jet). Unless noted otherwise, imaging was performed with a flying spot scanner with a linear velocity of 3200 cm/sec. The laser was a 1064nm wavelength Nd:YAG laser at 1.8W on the film plane and a 18 $\mu$m spot (full width at 1/$e^2$).

Solutions used in the examples are as follows:

"AD-5 BAMO" Preparation:

BAMO (poly[bis(azidomethyl)oxetane]) was obtained from the Aerojet Corp. The material had a MW of about 4500 as determined by GPC. A suspension of 5 g of BAMO in 45 g of MEK was warmed to ~60° C. until the polymer dissolved and then 250 mg of acetylene dicarboxylic acid was added. The resulting solution was heated in a sealed jar at 60° C. for 3 h and then cooled to room temperature before use. NMR analysis indicated the reaction of the alkyne, presumably to form the substituted triazole.

"AD-10 BAMO" was prepared similarly to the AD-5 BAMO. 10g of acetylene dicarboxylic acid was added to a solution of 40g BAMO and heated to 50° C. for 10 hours. The resulting solution was rotory evaporated to a viscous semi-solid (less than 3% residual solvent), and redissolved in a mixture of 3.9 g ethanolamine, 88 g isopropyl alcohol, and 175g water at 40° C. "GAP-triol" refers to a triol-terminated GAP (glycidyl azide polymer) polymer made according to the procedure disclosed in U.S. Pat. No. 4,962,213, incorporated herein by reference, and having a molecular weight of about 3,500 and a polydispersity index of less than 2.5.

The following pigment dispersions were prepared according to the recommendations of the manufacturer (CIBA-GEIGY Corp.), using distilled water, concentrated aqueous ammonia and isopropyl alcohol: Microlith Blue 4G-WA, Microlith Yellow 3G--WA, Microlith Yellow 2R-WA, Microlith Red RBS--WA.

UV1:
To 1g H$_2$O was added 10 mg of conc NH3 and 50 mg Uvinul MS40 (a UV light absorber from GAF Corp.)

63F:
3 g water;
1.2g C.-G. magenta dispersion (25% wt. solids);
0.3g Vancryl TM 600 emulsion (an adhesive from Air Products and Chemicals Inc.);
1g of a 5% wt. solids solution of FC 170C (a fluorocarbon surfactant from 3M) in 1:1 iPrOH:H$_2$O (isopropyl alcohol); and 1g UV1

104C:
2g water;
1.2g C.-G. blue dispersion (25% wt. solids);
0.1g Vancryl TM 600 emulsion (an adhesive from Air Products and Chemicals Inc.);
1g of a 5% wt. solids solution of FC 170C (a fluorocarbon surfactant from 3M) in 1:1 iPrOH:H$_2$O; and 1g UV1

104Y:
3g water;
0.6g C.-G. yellow 2R dispersion (25% wt. solids);
0.6g C.-G. yellow 3G dispersion (25% wt. solids);
0.1g Vancryl TM 600 emulsion (an adhesive from Air Products and Chemicals Inc.);
1g of a 5% wt. solids solution of FC 170C (a fluorocarbon surfactant from 3M) in 1:1 iPrOH:H$_2$O; and 1g UV1

104EQ:
5.6g MEK;
0.06g GAP triol (see above);
0.12g AD-5 BAMO (see above); and
0.1g FC 170C (a fluorocarbon surfactant from 3M)

60A
A dispersion of CIBA-GEIGY Microlith Blue 4GWA was prepared following the directions from the manufacturer using distilled water, triethanolamine, and isopropyl alcohol.

97A:
1.18g water;
1g of the AD-10 BAMO solution (see above);
0.9g of 60A (25% solids);
0.4g Vancryl TM 600 emulsion (an adhesive from Air Products and Chemicals Inc.); and
6 drops 5% FC-170C (a fluorocarbon surfactant from 3M) in 1:1 iPrOH:H$_2$O

EXAMPLE 1

Microstructured PET film was produced in accordance with U.S. Pat. No. 4,340,276 by sputter coating 3 mil PET with Cr, and etching with oxygen plasma. The features of the resulting material were tapering columns irregularly distributed on the film with radii of 5-50 nm and height about 100-200 nm. These were spaced from one another by 75-300 nm. This material was then vapor coated with black aluminum (a mixture of aluminum and oxygen) in accordance with U.S. Pat. No. 4,430,366 to a transmission optical density of 0.75. The geometry of this material was as illustrated in FIG. 1. On this structured surface absorber was coated solution 104Y using a #4 Meyer rod This was oven dried at 60° C. for 3 min and then imaged. The sample showed good image-wise transfer of the pigmented layer to both types of receptor papers with no background stain. ROD (i.e., reflection optical density) of the solid imaged area was found to be 0.9 using a Gretag D-186 and status T filters.

EXAMPLE 2

Everything was repeated as for Example 1, except the substrate was plain (i.e., nonmicrostructured) 4 mil PET with a 0.75 optical density coating of black aluminum. No transfer was apparent to either type of receptor paper.

EXAMPLE 3

The microstructured, black aluminum coating of Example 1 was coated with 63F with a #4 Meyer rod, oven dried at 60° C. for 3 min, and then imaged. The sample showed good image-wise transfer of the pigmented layer to both types of receptor papers, with no background stain. ROD of the solid imaged area was found to be 1.1 using a Gretag D-186 and status T filters.

EXAMPLE 4

Everything was repeated as for Example 3, except the substrate was plain 4 mil PET with a 0.75 optical density coating of black aluminum. No transfer was apparent to either type of receptor paper.

EXAMPLE 5

The microstructured, black aluminum coating of Example 1 was first coated with 104EQ with a #4 Meyer rod, oven dried at 60° C. for 3 min, and then overcoated using solution 104C (#4 Meyer rod, oven dried at 60° C. for 3 min). This was then imaged. The sample showed good image-wise transfer of the pigmented layer to both types of receptor papers, with no background stain. ROD of the solid imaged area was found to be 1.2 using a Gretag D-186 and status T filters.

EXAMPLE 6

The two layer coating of example 5 was made on plain 4 mil PET with a 0.75 optical density coating of black aluminum. No transfer was apparent to either type of receptor paper.

EXAMPLE 7

The microstructured, black aluminum coating of Example 1 was first coated with 104EQ with a #4 Meyer rod, oven dried at 60° C. for 3 min, and then overcoated using solution 63F (#4 Meyer rod, oven dried at 60° C. for 3 min). This was then imaged. The sample showed good image-wise transfer of the pigmented layer to both types of receptor papers, with no background stain.

EXAMPLE 8

The Donor material resulting from laser exposure in Example 7 was then used to expose a negative-acting Viking TM printing plate (commercially available from 3M). After exposure in a Berkey Askor printing frame equipped with a 2KW photopolymer bulb and aqueous development using the Viking TM developer (3M), a reversal image of good quality was obtained on the printing plate. This example illustrates that the same donor sheet can be used to produce both a proof and a negative film for a printing plate.

EXAMPLE 9

The two layer coating of Example 7 was made on plain 4 mil PET with a 0.75 optical density coating of black aluminum. No transfer was apparent to either type of receptor paper.

EXAMPLE 10

A sample was made with the overprinting of each of the three donors in examples 1, 5, and 7 onto the HP paper. Good overprinting was seen for dots on dots, solids on dots, dots on solids, and solids on solids.

EXAMPLE 11

The same donor sheet in Example 7 was imaged in the vacuum hold-down apparatus while in contact with a 3M S2 Viking ™ printing plate substrate. The sample showed good image-wise transfer of the pigmented layer to produce a lithographic printing plate.

EXAMPLE 12

The microstructured, black aluminum coating of Example 1 was coated with 97A using a #4 Meyer rod, oven dried at 60° C. for 3 min, and then imaged. The sample showed good image-wise transfer of the pigmented layer to both types of receptor papers, with no background stain. ROD of the solid imaged area was found to be 1.3 using a Gretag D-186 and status T filters. Microscopic examination of the imaged area at 400X with transmitted light showed the presence of small amounts (less than 2% area coverage) of black particles, all of which were less than 4 micrometers in diameter. These are presumed to be particles from the black aluminum layer which were carried over with the pigmented layer during imaging. The uniformity and color of the image is not noticeably affected by their presence.

EXAMPLE 13

Everything was repeated as in Example 12 except that the substrate was plain 4 mil PET with a optical density coating of black aluminum. Visual examination of the imaged area of the paper shows a blochy, uneven, and dark coloration in areas of cyan color. Examination at 400X showed there to be irregular dark plates of black aluminum in the pigmented (i.e., imaged) areas. Many of these are larger than 10 micrometers in diameter.

What is claimed is:

1. A thermal transfer donor element, comprising:
   a) a substrate having a microstructured surface, said surface comprising a plurality of randomly positioned discrete protuberances of varying heights and shapes;
   b) a black metal layer on said microstructured surface;
   c) a gas-producing polymer layer having a thermally available nitrogen content of greater than about 10 weight percent, said gas-producing polymer layer being over said black metal layer; and
   d) a thermal mass transfer material in or over said gas-producing polymer layer.

2. The donor element of claim 1 wherein said substrate is substantially transparent.

3. The donor element of claim 1 wherein said protuberances have a height ranging from 10 to 1500 nm, and are separated from adjacent protuberances at a distance ranging from 3 to 500 nm.

4. The donor element of claim 1 wherein said black metal layer comprises a mixture of metal oxide and metal.

5. The donor element of claim 1 wherein said black metal layer comprises black aluminum, black tin, or black titanium.

6. The donor element of claim 1 wherein said black metal layer has a transmission optical density of at least 0.3.

7. The donor element of claim 6 wherein said black metal layer has a transmission optical density of at least 0.8.

8. The donor element of claim 1 wherein said black metal layer has a thickness ranging from 0.01 to 1 micrometer.

9. The donor element of claim 1 wherein said gas-producing polymer layer has a thermally available nitrogen content of greater than about 20 weight percent.

10. The donor element of claim 9 wherein said gas-producing polymer layer has a thermally available nitrogen content of greater than about 30 weight percent.

11. The donor element of claim 1 wherein said gas-producing polymer layer contains a gas-producing polymer having the formula

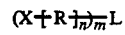

wherein:
X represents a hydroxyl, azide, mercapto, or amino group;
R represents a divalent monomer group, containing a N3 group, derived from a cyclic ether, a cyclic sulfide, or a cyclic amine;
L represents a mono-, di-, tri- or tetra-valent alkyl radical, and correspondingly,
m represents 1, 2, 3, or 4; and
n represents any integer greater than 1.

12. The donor element of claim i wherein said gas-producing polymer layer contains a polyoxetane having recurring units of the formula

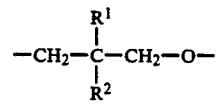

wherein $R^1$ and $R^2$ each independently represent a thermally decomposable nitrogen-containing group.

13. The donor element of claim 1 wherein said gas-producing polymer layer contains a block or random copolymer comprising units derived from at least two different monomers, at least one of said monomers containing an energetic nitrogen-containing group.

14. The donor element of claim 1 wherein said thermal mass transfer material is in said gas-producing polymer layer, said layer having a dry coating weight ranging from 0.3 to 2.0 g/m².

15. The donor element of claim 1 wherein:
said thermal mass transfer material is in a layer over said gas-producing polymer layer;
said gas-producing polymer layer has a dry coating weight ranging from 0.01 to 1.0 g/m²; and
said thermal mass transfer material has a dry coating weight ranging from 0.3 to 2.0 g/m².

16. The donor element of claim 1 wherein said thermal mass transfer material comprises a colorant.

17. The donor element of claim 16 wherein said colorant is in said gas-producing polymer layer.

18. The donor element of claim 16 wherein said colorant comprises a pigment.

19. The donor element of claim 16 wherein said colorant comprises a dye.

20. The donor element of claim 1 wherein said protuberances are columnar with a height ranging from 10 to 1500 nm, and are separated from adjacent protuberances at a distance ranging from 3 to 500 nm.

21. A process for forming a thermal transfer image, comprising the steps of:
   a) contacting a receptor surface with the layer of the donor element of claim 1 which contains said thermal mass transfer material; and
   b) imagewise irradiating said donor element with sufficient energy to produce gas from said gas-producing polymer, thereby transferring the thermal mass transfer material of said donor element to said receptor surface in the imagewise irradiated areas.

22. A thermal transfer donor element, consisting of:
   a) a substrate having a microstructured surface, said surface comprising a plurality of randomly positioned discrete protuberances of varying heights and shapes;
   b) a black metal layer on said microstructured surface; and
   c) a thermal mass transfer material over said black metal layer.

23. The donor element of claim 22 wherein said substrate is substantially transparent.

24. The donor element of claim 22 wherein said protuberances have a height ranging from 10 to 1500 nm, and are separated from adjacent protuberances at a distance ranging from 3 to 500 nm.

25. The donor element of claim 22 wherein said black metal layer comprises a mixture of metal oxide and metal.

26. The donor element of claim 22 wherein said black metal layer comprises black aluminum, black tin, or black titanium.

27. The donor element of claim 22 wherein said black metal layer has a transmission optical density of at least 0.3.

28. The donor element of claim 27 wherein said black metal layer has a transmission optical density of at least 0.8.

29. The donor element of claim 22 wherein said black metal layer has a thickness ranging from 0.01 to 1 micrometer.

30. The donor element of claim 22 wherein said thermal mass transfer material comprises a colorant.

31. The donor element of claim 30 wherein said colorant comprises a pigment.

32. The donor element of claim 30 wherein said colorant comprises a dye.

33. A process for forming a thermal transfer image, comprising the steps of:
   a) contacting a receptor surface with the layer of the donor element of claim 22 which contains said thermal mass transfer material; and
   b) imagewise irradiating said donor element with sufficient energy to cause said thermal mass transfer material to transfer from said donor element to said receptor surface in the imagewise irradiated areas.

* * * * *

UNITED STATES PATENT AND TRADEMARK OFFICE
CERTIFICATE OF CORRECTION

PATENT NO. : 5,326,619
DATED : July 5, 1994
INVENTOR(S) : William V. Dower and Mark K. Debe It is certified that error appears in the above-indentified patent and that said Letters Patent is hereby corrected as shown below:

Column 3, line 15, "I micrometer" should read --1 micrometer--.

Column 7, line 66, delete the word "anamine", and insert therefor --an amine--.

Column 8, line 19, "--C$_2$CH" should read --CH$_2$CH--.

Column 11, line 1 "Fluorad#" should read --Fluorad™--.

Column 11, line 55, "i" should read --1--.

Signed and Sealed this

Seventeenth Day of January, 1995

Attest:

BRUCE LEHMAN

*Attesting Officer*     Commissioner of Patents and Trademarks